United States Patent
Mantl

(10) Patent No.: US 7,442,657 B2
(45) Date of Patent: Oct. 28, 2008

(54) PRODUCING STRESS-RELAXED CRYSTALLINE LAYER ON A SUBSTRATE

(75) Inventor: Siegfried Mantl, Jülich (DE)

(73) Assignee: Forschungszentrum Julich GmbH, Julich (DE)

( * ) Notice: Subject to any disclaimer, the term of this patent is extended or adjusted under 35 U.S.C. 154(b) by 178 days.

(21) Appl. No.: 10/548,620

(22) PCT Filed: Feb. 6, 2004

(86) PCT No.: PCT/DE2004/000200

§ 371 (c)(1),
(2), (4) Date: Sep. 8, 2005

(87) PCT Pub. No.: WO2004/082001

PCT Pub. Date: Sep. 23, 2004

(65) Prior Publication Data

US 2006/0166475 A1    Jul. 27, 2006

(30) Foreign Application Priority Data

Mar. 10, 2003  (DE) .................... 103 10 740

(51) Int. Cl.
H01L 21/00 (2006.01)
(52) U.S. Cl. .............. 438/933; 438/197; 438/506; 257/E21.054; 257/E21.092; 257/E21.102; 257/E21.115; 257/E21.248
(58) Field of Classification Search .......... 438/933, 438/197, 911, 311, 505, 509, 514, 474, 475, 438/522, 530, 603, 604, 752, 753, 506
See application file for complete search history.

(56) References Cited

U.S. PATENT DOCUMENTS 5,461,243 A * 10/1995 Ek et al. ............... 257/190
5,906,951 A * 5/1999 Chu et al. .............. 438/751

(Continued)

FOREIGN PATENT DOCUMENTS

EP  1 351 284  10/2003

(Continued)

OTHER PUBLICATIONS

"Dependence of damage and strain on the termperature of Si irradiation in epitaxial . . ." Lie et al, J. Applied Physics 77 (6) Mar. 15, 1995.

(Continued)

*Primary Examiner*—David Nhu
(74) *Attorney, Agent, or Firm*—Andrew Wilford

(57) ABSTRACT

A stress relaxed monocrystalline layer structure is made on a nonlattice matched substrate by first applying to the substrate epitaxially a monocrystalline layer structure comprising at least one layer, the monocrystalline layer structure forming with the substrate an interface that has a greater lattice parameter mismatch on the substrate than within the monocrystalline layer structure. The monocrystalline layer is irradiated by directing an ion beam to generate predominantly point effects in the monocrystalline layer structure and an extended defect region in the substrate proximal to the monocrystalline layer structure. Then the monocrystalline layer structure is thermally treated in a temperature range of 550° C. to 1000° C. in an inert, reducing or oxidizing atmosphere so that the monocrystalline layer structure above the extended defect region is stress relaxed and has a defect density less than $10^6$ cm$^{-2}$ and a surface roughness of less than 1 nm.

27 Claims, 1 Drawing Sheet

U.S. PATENT DOCUMENTS

| | | | |
|---|---|---|---|
| 5,963,817 A * | 10/1999 | Chu et al. | 438/410 |
| 6,039,803 A | 3/2000 | Fitzgerald et al. | |
| 6,059,895 A * | 5/2000 | Chu et al. | 148/33.1 |
| 6,154,475 A | 11/2000 | Soref | 372/45 |
| 6,515,335 B1 * | 2/2003 | Christiansen et al. | 257/347 |
| 6,589,856 B2 * | 7/2003 | Curless | 438/479 |
| 6,594,293 B1 * | 7/2003 | Bulsara et al. | 372/43.01 |
| 7,169,619 B2 * | 1/2007 | Liang et al. | 438/3 |
| 2002/0017642 A1 | 2/2002 | Mizushima et al. | |
| 2002/0140031 A1 | 10/2002 | Rim | 257/347 |
| 2002/0185686 A1 | 12/2002 | Christiansen | 257/347 |

FOREIGN PATENT DOCUMENTS

| | | |
|---|---|---|
| WO | WO 02/15244 | 2/2002 |
| WO | WO 03/069658 | 8/2003 |
| WO | WO 03/092058 | 11/2003 |

OTHER PUBLICATIONS

"Epitaxial growth and optical properties of II-VI Compound Semiconductors fo roptoelectronic devices" Makino et al, ITEE Seminar, Jun. 2006.

* cited by examiner

PRODUCING STRESS-RELAXED CRYSTALLINE LAYER ON A SUBSTRATE

CROSS REFERENCE TO RELATED APPLICATIONS

This application is the US national phase of PCT application PCT/DE2004/000200 filed 6 Feb. 2004 with a claim to the priority of German patent application 10310740.1 itself filed 10 Mar. 2003 and whose entire disclosures are herewith incorporated by reference.

FIELD OF THE INVENTION

The invention relates to a method of producing a layer system comprising a stress-relaxed monocrystalline layer structure on a substrate with a respectively different lattice structure. In addition, the invention relates to the use of such a layer system in electronic and/or optoelectronic components. In particular the method serves for the production of a strained layer, for example of strained silicon on a thin stress-relaxed layer system for example comprised of silicon-germanium.

STATE OF THE ART

The rapid advance in nanoelectronics requires ever more fast-acting transistors, especially metal oxide field-effect transistors (MOSFETs). A power increase accompanied by a reduction in the transistor's dimensions is as a rule desired. This however is very expensive and dear since the key technologies in chip production, like the lithographic method and the etching method have to be replaced by more efficient systems. An alternative approach is the use of more efficient material and for this, especially the use of strained silicon, strained silicon-germanium (Si—Ge) or silicon-carbon (Si—C) and silicon-germanium-carbon (Si—Ge—C) have been proposed. In addition, elastically stressed layer systems have been proposed, utilizing epitactic growth on special substrates or on stressed relaxed layers (so-called virtual substrates) whose production with a low level of defect density is very expensive and difficult. (F. Schaeffler, Semiconductor Sci. Techn. 12 (1997) p. 1515-1549).

Basically the production of monocrystalline layers is limited sharply by the available substrate material which affect the quality of the layers produced. Different crystal structures and different lattice parameters between substrates and coating materials (lattice defect matching) limit as a rule the monocrystalline growth of layers of higher quality. If in the case of unmatched lattice parameters, monocrystalline layers are deposited, at the beginning mechanical stresses develop such that lattice structures deviate from the original. When the deposited layer exceeds a certain stress level, the mechanical stress results in defect formation and the lattice structure approaches the original more closely. This process is called stress relaxation and hereinafter is referred to only as "relaxation".

At the layer thicknesses which are mostly used for components, this relaxation causes defects at the interface between the deposited layer and the substrate which can include disadvantageously multiple offsettings which can run from the interface to the layer surface (so-called threading dislocations). Since most of these defects propagate further through new growing layers, they significantly reduce the electrical and optical properties of the layer material.

The use of silicon or silicon germanium (Si—Ge), silicon carbon (Si—C) or silicon-germanium-carbon (Si—Ge—C) in a certain elastic distortion state improves the material characteristics, especially for components in which charge carrier mobility of the electrons and holes is important. The use of these and other high-value materials enables a significant performance increase to Si based high power electronic components, like MOSFETs and MODFETs without requiring modification of critical structural values of the electronic component. In order to provide that the same layer system, apart from an increased electron mobility, also with a significant improvement in the hole mobility, in accordance with Oberhuber et al., Physical Review B 58(15) (1998) p. 9941-9948 the tetragonal distortion in the stressed silicon must be greater than about 1.3%. This can be achieved by providing the strained silicon on a "virtual substrate", for example comprised of a Si—Ge layer relaxed to 100%, with at least 30 atomic % Ge, by epitaxial deposition.

Since the silicon-germanium (SiGe) material system is thermodynamically a fully miscible system, the compound can be made with optional concentration of silicon and germanium. Silicon and germanium are characterized in that they indeed have the same crystal structure but differ with respect to their lattice parameters by about 4.2%, that is a SiGe layer or a pure Ge layer can be grown in a stressed state on silicon. Carbon can only be introduced as a substituent in silicon only to about 2 atomic % in order to reduce the lattice parameter.

The state of the art for producing for example stress-free, qualitatively high valued silicon-germanium (SiGe) alloy layers on a silicon substrate, includes the use of so-called "graded layer" techniques. In this case, SiGe layers are involved whose Ge concentration increases toward the surface continuously or stepwise until the desired Ge content is reached. Since for maintaining the layer quality, only an increase of the Ge content of about 10 atomic % per µm can be used, such layers have a thickness up to 10 µm to achieve the Ge concentration. For the layer growth this is not satisfactory from an economical and technological point of view.

The layer growth of this graded layer is described in E. A. Fitzgerald et al., Thin Solid Films, 294 (1997) 3-10. This method however provides excessively high layer roughness and leads to dislocation multiplication and thus to crystallographic tilting of regions so that extensive polishing of the layer is required.

From Leitz et al., Applied Physics Letters, Vol. 79(25) (2001), p. 4246-4248 and Cheng et al., Mt. Res. Soc. Symp., Vol. 686 (2002) A1.5.1-A1.5.6), methods for producing structures of wafer bonds and etching have been proposed. It is a drawback of these methods that they are expensive and technologically complex since many highly sensitive processed steps are involved.

In WO 99/38201, a method has already been proposed which permits the production of thin stressed-relaxed Si—Ge buffer layers. It is a drawback of this method however that the degree of relaxation which can be obtained is relatively small (typically 50-70%) and falls off with increasing Ge content and that the dislocation density in the relaxed Si—Ge layer is relatively high. For example for a 28 atomic % germanium containing 100 nm thick Si—Ge layer, a dislocation density in the region of $10^7$ cm$^{-2}$ has been determined (Luysberg et al; Journal of Applied Physics 92 (2002) p. 4290). The method is especially limited when it comes to still higher Ge concentrations since the layer thickness of the relaxed Si—Ge layer must be still smaller (less than 100 nm). This is required since otherwise dislocations form already during the growth.

The relaxation degree which can be achieved and thus the minimal dislocation density depends, in homogeneous Si—Ge layers, greatly upon the layer thickness, since the forces which operate on a threading dislocation are proportional to the layer thickness.

OBJECT OF THE INVENTION

It is the object of the invention to provide a method of making a stress relaxed layer structure on a substrate which is not matched to the lattice, like for example a Si—Ge layer packet on a silicon substrate or silicon on insulator (SOI) substrate so that the drawbacks which characterize the state of the art, will not be present. Especially, in an advantageous configuration of the invention, strained silicon on unstressed silicon-germanium (Si—Ge) or some other suitable material with respectively different lattice structures can be made which advantageously ensure planarity for the further processing of electronic components as may be required.

In addition it is an object of the invention to provide electronic and/or optoelectronic components which have the above-mentioned advantageous layer structure.

SUMMARY OF THE INVENTION

Within the scope of the invention it has been surprisingly found that a very well relaxed layer structure on a substrate which has not been lattice matched, unlike the system which has been customary up to now, by the deposition of a layer structure which has a relatively high lattice parameter mismatch $\Delta f_1$ to the boundary of the substrate. This lattice parameter mismatch at the boundary to the substrate should be at least 1.5% and advantageously more than 2%, and especially about 4%. Examples of one such layer sequence with a correspondingly high lattice parameter mismatch is among others an Si substrate with a deposited Ge layer or an Si substrate with an applied Si—Ge layer with at least 30 atomic % Ge content.

Apart from the high lattice parameter mismatch $\Delta f_1$ at the boundary to the substrate, the layer structure has in the intermediate regions of the layer structure a composition with a further lattice parameter mismatch $\Delta f_2$ which is smaller relative to the substrate than $\Delta f_1$ and advantageously is only half as high. Such a layer structure has either at least two concrete layers with different compositions and different lattice parameter mismatches ($\Delta f_1$ and $\Delta f_2$) relative to the substrate, or however at least one graded layer in which the germanium concentration varies perpendicularly to the substrate outer surface.

Examples for a suitable two layer structure (sequence: first layer bounding on the substrate, second layer) are, among others, germanium—Si—Ge or $Si_{1-x}Ge_x$—$Si_{1-y}Ge_y$ with x greater than y or also GeC—SiGe. In general, these layers also can have in addition 1-2 atomic % carbon.

The first advantageous variation of the germanium concentration in a graded layer of the layer structure is a continuously falling concentration from the substrate/layer structure boundary surface or interface to the outer surface of the layer structure. In this case $\Delta f_2$ represents the lattice parameter mismatch of the outer surface composition of the layer structure relative to the substrate.

A further advantageous variation is the formation of a U profile in which the germanium concentration at the substrate/layer structure interface and at the outer surface of the layer structure is higher than that in an intermediate region of the layer structure. In this case, $\Delta f_2$ represents the lattice parameter mismatch of the composition in the intermediate region of the layer structure or the composition with the least Ge content in the layer structure with respect to the substrate.

As especially suitable material for a graded layer structure, especially Si—Ge, Si—C and Si—Ge—C can be mentioned.

The total layer thickness of the epitactic layer structure should be so selected that it falls below a thickness at which the dislocation density will exceed $10^3/cm^2$ (defect density). With a multilayer layer structure, in addition, it must be ensured that the first layer which bounds on the substrate has a layer thickness which is smaller than the so-called critical layer thickness for this layer. The critical layer thickness defines a maximum layer thickness for this layer at which a defect-free growth is possible on the nonlattice-matched substrate. With a layer thickness below this critical thickness, as a rule a strongly pseudomorphic state prevails, that is completely defect-free growth can develop.

The layer thicknesses of the first layer to be deposited can be selected by the artisan based upon the magnitude of the critical layer thickness or the magnitude of the lattice parameter mismatch. In general, the higher the lattice parameter mismatch the smaller the critical layer thickness. With the materials used here, the layer thickness of a first layer lies as a rule between 1 and 20 nm, advantageously between 1 and 15 nm. With the combination of an Si substrate and an applied pure germanium coating deposited thereon the suitable layer thickness for the germanium layer will be only 3 to 4 nm. With a three layer configuration of the layer structure, this will apply not only for the first layer but also for the third layer.

The layer thickness of the second layer is as a rule selected to be significantly higher (50 to 400 nm). What is important is only that the overall layer thickness of the layer structure be held small enough that the dislocation density as a rule is less than $10^3/cm^2$.

Within the scope of this invention it has been found that such monocrystalline layer structure epitactically applied as has been described, above a buried defect region produced by ion implantation in the substrate layer can be stress relaxed very well by a thermal and/or oxidative treatment. This applies especially in the case of the use of materials for the layer structure which, by comparison with the materials used in the state of the art, have a relatively high lattice mismatch with reference to the substrate.

The proportion of the stress-relaxed layer structure according to the invention, after a thermal and/or oxidative treatment is as a rule higher than 60% and especially is higher than 70%. Such a layer structure with a high degree of relaxation and a very small dislocation density is also referred to as "virtual substrate".

In a first aspect of the method one starts with a layer sequence on a substrate on which at least two epitactic layers with different chemical compositions and different layer thicknesses are epitactically deposited, whereby the first layer with a layer thickness $d_1$ has a greater change in the lattice parameters and thus a greater elastic distortion or strain with respect to the substrate. The first layer can for example be a pure germanium layer on silicon or an Si—Ge layer with a high Ge content on silicon in a single monolayer thickness or a thickness of only a few monolayer thicknesses. The layer thickness of the first layer $d_1$ (for example $d_1$=1-20 nm) must be smaller than the so-called critical layer thickness at which defect-free growth is possible. On the first layer, a second substantially thicker Si—Ge layer can for example be applied with a predetermined concentration, for example 30 atom % Ge, and a layer thickness $d_2 \gg d_1$; for example 50 nm<400 nm). The overall layer thickness $d_1$ and $d_2$ should not exceed the critical thickness at which the dislocations form with a density>$10^3$ cm$^{-2}$ during the growth. This implies that the total layer thickness or overall thickness also must lie above the so-called "critical layer thickness" which guarantees strictly pseudomorphic, that is completely defect-free growth. In an alternative embodiment or mode of the method to the previously described two-layer system, an epitactic layer is deposited with a continuous concentration gradient on the substrate. The concentration gradient should be constant or can, for example, have a U-shaped pattern.

Alternatively in the method also a three layer system based upon the two layer system can be produced. In that case on the first layer and the second layer a further or third layer can be deposited. This has, like the first layer, a high concentration and a low layer thickness. In this case, like in the embodiment with the U-shaped symmetrical stress distribution will be produced in the layer structure.

The use of this special layer system has as its goal to so optimize the layer parameters required for the relaxation that a substantially higher degree of relaxation can be achieved together with a smaller dislocation density in the virtual substrate which is thus produced even with the higher lattice mismatch (for example with higher Ge concentration) after suitable ion implantation and thermal treatment. The plastic relaxation through dislocation depends upon the layer thickness and the respective stress.

By contrast with the state of the art, where buffer layers with graded Ge content are used and whereby the growth begins at the interface with the substrate as a rule with the smaller Ge content and the Ge content is only increased stepwise so that the lattice parameter change is held small, the invention provides an entirely new approach to the production of such advantageous layer structures.

Within a very thin layer region (either the first layer in a two or three-layer layer structure or starting region of a graded layer structure) the elastic lattice distortion or strain is elevated at the substrate interface by a suitable choice of the layer composition. In a region adjacent it (second layer in a two or three-layer layer position, in a region adjacent it (second layer in a two or three-layer layer structure or the intermediate or outer surface region of a graded layer structure) the composition is either intensively or gradually reduced to the Ge content required for the desired relaxation. This effect can be enhanced by a third region (third layer of a three-layer layer structure with increased Ge concentration or the surface region of a graded layer structure with a U profile).

To achieve the desired effect that in the starting region between the substrate and the layer structure a relatively high lattice distortion or strain will arise, this can be achieved within the scope of the invention not only by the application of a first layer with higher lattice parameter mismatch with respect to the substrate but also in that the substrate itself, by the introduction of carbon, can have an increased lattice parameter mismatch with respect to the layer structure.

In order to produce stressed silicon in an advantageous mode of the method or also to achieve protection of the layer system, in addition a further thin layer can be epitactically deposited on the layer structure. For this, especially, epitactic silicon is suitable. This deposit can, when the layer thickness is sufficiently small, be effected before or after or between the subsequent process steps of ion implantation and the thermal treatment.

According to the method of the invention primarily beneath this epitactic layer structure an defect region is produced by an ion implantation. Depending upon layer thickness, ion type, ion energy and ion dose, the epitactic layer structure is also affected. The implantation conditions are so selected that as a rule no complete amorphization of the epitactic layer structure can result and the defects in the epitactic layer structure can be healed to the greatest possible extent.

This layer sequence of substrate with defect regions and deposited layer system and optionally further epitactically applied layer is then thermally so treated that the layer structure which forms the virtual substrate is stress relaxed above the defect region. One thereby obtains directly at least one epitactic layer structure with an altered stress state on a substrate.

The implantation can optionally be effected also with use of an implantation mask only in partial regions of the substrate, especially a wafer. In such a case the stressed state is relaxed for the epitactic layer structure substantially only above the implanted defect region. The reference to "defect lattice structure" is to be understood in the framework of this invention to refer to material with different lattice parameters or different crystal structures.

The aforementioned layer sequence of substrate/defect regions and epitactic layer structure can be produced in different ways. It can for example be made by depositing a layer structure epitactically on a substrate and then (partially) producing a defect region primary beneath the interface of the deposited layer. One is not however wedded to this sequence of method steps. The formation of the layer sequence can be varied advantageously, for example in that the defect region can be produced before or after depositing a first epitactic layer on the substrate it will be apparent that in the sense of this invention further layers also can be provided for example a thin transition layer can be provided in practice between the substrate and the first epitactic layer which is comprised of the same material as the substrate.

The defect region can be provided by ion implantation, preferably with light ions (hydrogen, helium, fluorine, boron, carbon, nitrogen, sulfur, etc.) or from ions of the layer material or substrate material themselves, thus for example Si or Ge in the case of an Si/SiGe heterostructure with the ions primarily being injected below the first epitactically deposited or still to be deposited layers. The implantation of light ions avoids excessively strong damage to the epitactic layer system. Advantageously ions are used which avoid undesired contamination or doping. In this structure, noble or inert gas ions (Ne, Ar, Ki, etc.) can be introduced. The implantation dose and the implantation depth are matched to the layer thicknesses of the epitactic layer structure and the mass and energy of the selected ions. It is advantageous to produce the maximum damage below the first layer applied to the substrate. This applies especially for ions which can give rise to bubble formation or crack formation (hydrogen, helium, fluorine, neon, argon, etc.). The formation of bubbles, for example hollows at the substrate/epitactic layer structure interface and in the epitactic layer structure itself, should be avoided. An advantage of silicon implantation by comparison to implantation with very light ions (hydrogen or helium) is that the dose can be significantly reduced (by a factor of 100). This shortens the implantation time and increases the wafer throughput as the substrate used significantly.

The layer sequence is thermally so treated or the thermal budget held so low that the implanted region of the "virtual substrate" is stress relaxed. From the defects which have been generated by the implantation, for example with helium or Si, the subsequent heat treatment or tempering creates defect clusters dn dislocations which partly run in the substrate and partly in the epitactic layer structure. These defects and those which arise in the epitactic layer structure effect a relaxation of the lattice stresses. The heat treatment results as a rule in a thin, partly or completely stress relaxed, epitactic layer structure with reduced structural defects in the crystallographic structure and which advantageously can be used as a "virtual substrate".

The relaxation can alternatively also be triggered by an oxidation with $O_2$ or water. Instead of a purely thermal treatment to form relaxed regions, an oxidation can be carried out following a thermal treatment or a combination of oxidation and thermal treatment can be used. For this purpose the concentrations of the elements which are important for the functioning of the electronic components are elevated within the layer structure (for example there is a Ge enrichment in SiGe).

The method utilizes process steps which are established in silicon technology so that the technology can also be translated to very large wafers (for example 300 mm Si wafers).

In connection therewith, according to the invention, at least one further epitactic layer is deposited on this layer sequence. The substrate beneath the first epitactic layer structure is present in a relaxed state. The material of the further epitactic layer is present again in a stressed state on the epitactic layer structure. The further deposited layer can be composed of the same material as the substrate. Since the epitactic layer structure as a rule is held within, for example, smaller than about 300 nanometers, especially smaller than 200 nm, it can be assured that an exceptional thermal conductivity will be maintained within the overall layer sequence. The epitactic layer structure and the further layer deposited thereon functions because of the thinness of the layers, approximately as a single plane with the substrate. By the expression "in a plane" or "in one plane", is therefore meant that the height of the stages resulting from deposition up to the surface of the substrate is not greater than the range permitted by the depth of field of the imaging optics of the lithography. This ensures that in the course of further method steps the planarity between the "virtual substrate" and the substrate will be sufficient. The layer sequence of the virtual substrate and optionally the further deposited layer has for example a thickness of about 100 to 400 nanometers, especially 100 to 200 nanometers or is still thinner. The production of a "system on a chip" (various electronic components with various functions in one plane) is thus advantageously possible within the scope of the invention. To this end for the production for example of MOSFETs, initially the gate dielectric (for example $SiO_2$), the source and drain contacts, the gate contacts, and optional spacers as well as channel regions, source regions and drain regions which lie therebelow and are differently doped, are fabricated and embedded in a passivation layer or insulating layer. Consequently one is not limited to certain transistor types or structural parts.

Instead of a silicon substrate, an SOI substrate (silicon on silicon dioxide) can be used for the deposition of the layer structure. The use of heavier ions is then especially advantageous when the silicon layer thickness on the oxide is so thin that for example no hydrogen bubbles or no helium bubbles can be generated any longer. This enables a truly small overall layer thickness to be provided on the oxide which is for example of special advantage for the production of special electronic components on SOI.

The layer system produced in accordance with the invention can be transferred to a support wafer by wafer bonding without requiring a polishing of the surfaces. The splitting of the layer system can be carried out by an additional hydrogen implantation and/or helium implantation through a so-called SMART-Cut process. Alternatively, etching can be used. The separation can be so effected that either only the further epitactic layer or also the layer structure will be transferred to the new wafer as a rule on $SiO_2$. Especially in the case of SiGe layers as the layer structure can these be advantageously selectively etched. In that case for example strained silicon can be made directly on $SiO_2$.

BRIEF DESCRIPTION OF THE DRAWING

Below the subject matter of the invention will be described in greater detail with reference to four Figures and examples or embodiments without limiting the scope of the invention thereby. The Figures show

SPECIFIC DESCRIPTION

Figure 1:
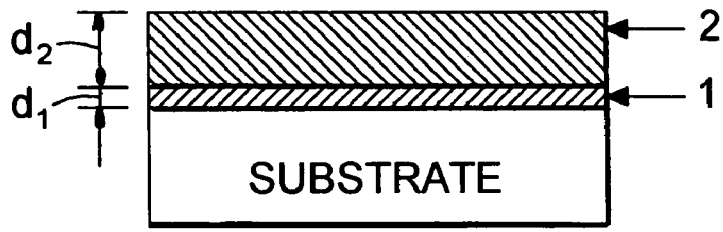
FIG. 1: A schematic illustration of a layer system comprising a substrate and a 2-layer layer structure epitactically applied thereto.

FIG. 1 shows the formation of a virtual substrate with two monocrystalline layers having respectively different lattice structures. The layer growth is effected preferably with gas phase epitaxy or with molecular beam epitaxy. On a silicon substrate an epitactic layer 1, for example a pure germanium layer of a thickness of several nanometers is epitactically deposited. Alternatively, a thin silicon-germanium layer can also be used with a high Ge content or a Si—C layer with 1 to 2 atomic % carbon. Then a silicon germanium (SiGe) layer 2 with a Ge concentration of a predetermined concentration, for example 30 atomic % Ge, and a layer thickness $d_2$ of 50 to 250 nm is deposited. It is to be noted that a higher total layer thickness is of advantage since as a rule it will lead to smaller dislocation density in the stress-relaxed virtual substrate.

Figure 2:
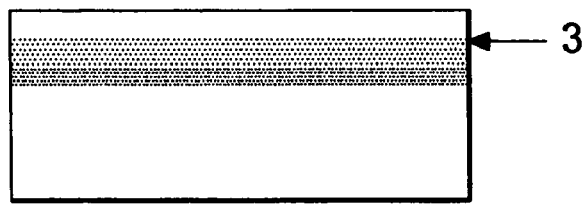
FIG. 2: A schematic illustration of a layer system comprising a substrate and a layer structure epitactically applied thereto, with a gradual monotonic concentration course perpendicular to the layer plane.
Figure 3:
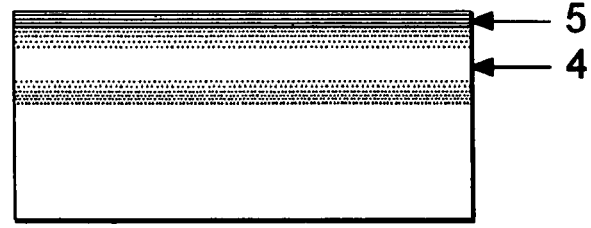
FIG. 3: A schematic illustration of a layer system comprising a substrate and a layer structure epitactically applied thereto with a gradual U-shaped concentration pattern perpendicular to the layer plane as well as a further strained layer.

Alternatively thereto as has been illustrated in FIG. 2 and FIG. 3, a Si—Ge layer with a sharply nonhomogeneous concentration pattern in the layer can be applied. What is important here is that the growth begins with a higher Ge concentration and possibly even with pure germanium and that the concentration then drops (for example to 30 atomic %). For a symmetrical stress build up a U-shaped concentration pattern can be used as has been shown in FIG. 4 in the layer 4. A symmetrical stress build up in the layer system can also be achieved by depositing a further layer on the layer 2 when this layer has characteristics similar to or identical to the characteristics of the layer 1. The overall layer thickness in all cases must lie below the layer thickness at which dislocations develop already during the growth with detrimental concentration (maximum $10^3$ cm$^{-2}$).

Figure 4:
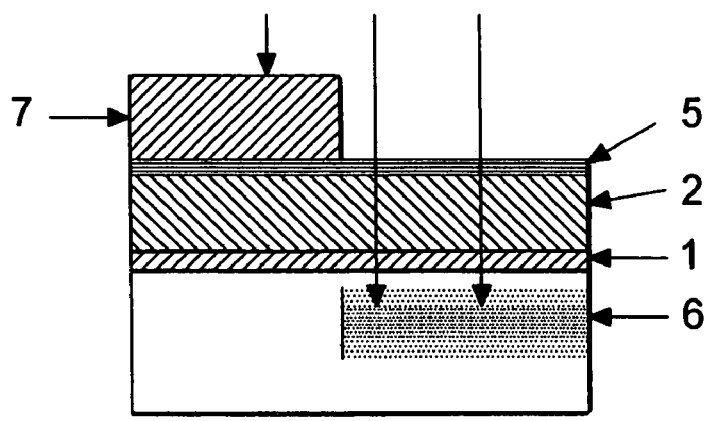
FIG. 4: A schematic illustration of a layer system comprising a substrate with a buried defect structure, a 2-layer epitactically deposited layer system, an implantation mask as well as a further strained layer.

If desired, a thin layer can also be additionally deposited, for example, a layer of silicon (layer 5 in FIG. 4). Below these deposited layers, a defect region can be generated, for example, by ion implantation. For this purpose, for example a He implantation can be carried out with a dose of about $1 \times 10^{16}$ cm$^{-2}$. The energy of the ions is so matched to the layer thickness that the mean range of the ions is about 100 to 200 nm beneath the first interface, that is within the substrate. As an alternative to He implantation, a Si implantation for example with an average of about 150 keV and a dose of about $1 \times 10^{14}$ cm$^{-2}$ for a 100 nm layer thickness of the silicon germanium (SiGe) layer 1 and 2 can also be used. The implanted ions produced crystal defects and beneath the SiGe layer.

Then follows for several minutes a thermal treatment or tempering at 900° C. in an inert $N_2$ atmosphere. Another inert gas (for example argon) or a gas which is suitable for the purposes of the invention (for example $O_2$ or former gas) can also be used. Above the defect region with this temperature regimen that need not be selected to be excessively high, develops a stress relaxed silicon germanium (SiGe) layer structure. This tempering temperature or oxidation temperature can be matched to the overall layer systems and to the electronic component fabrication process and thus can be reduced to a substantial lower temperature. For example, a stress relaxation can be achieved after suitable ion implantation already at temperatures of about 600° C.

The layer sequence according to the invention on the substrate can, as in the first example or embodiment, have a thickness of about 50 to 500 nanometers or less to satisfy these requirements.

A further layer 5 can be epitactically applied to the stress relaxed silicon germanium (SiGe) layer 2 (FIG. 4). This further layer 5 is then stressed by the corresponding lattice mismatch. It can for example be formed of silicon or also from silicon germanium (SiGe) with a different germanium concentration than that in the epitactic layer 2, or also from a multiple coating. In the case of silicon, stressed silicon is produced. Because of the thinness of the layers 1, 2 and 5, however, the planarity in the sense of the above definition of the different regions of the layers 1, 2 and 5 as well as the thermal conductivity to the substrate are ensured.

Layer 5 in FIG. 4 (stressed silicon) can, because of the higher mobility of the charge carriers, be used advantageously for producing ultrafast MOSFETs especially n-channel and p-channel MOSFETs.

Advantageously, p-MOSFETs can also be produced on nonstressed regions of the layer structure. These regions arise, for example, when during the ion implantation, a mask is used. Since usually only the regions of the layer structure will lie above the buried defect regions of the substrate are relaxed, the regions of the layer structure which lie above the mask-protected regions of the substrate are usually uniformly stressed.

One can however also start with other layer sequences and processing:

Apart from silicon germanium (SiGe) and Si—Ge—C and Si—C as the first epitactic layer 1 and 2, or 3 or 4, as a general matter other III-V compounds (especially III-V nitrides) (GaN, AlN, InN) and also oxidic perovskites can be used as the first epitactic layer. That is important in any case is only that suitable materials be disposed on a suitable substrate so that at least one layer (5) can be provided with a different lattice structure on the "virtual substrate" thus produced. Thereafter the formation of an electronic component can be carried out to produce the electronic components like transistors.

The layer sequence produced in accordance with the method of the invention can be utilized to fabricate metal oxide semiconductor field effect transistors (NOSFETs) and modulated doped field effect transistors (MODFETs). It is also possible to make resonant tunnel diodes (especially a resonant silicon germanium (SiGe) tunnel diode or quantum cascade laser on such "virtual substrate". Further it is conceivable to produce a photo detector on the layer sequence. In addition it is conceivable starting from a layer sequence with GaAs as the layer 5 on a virtual substrate of silicon germanium (SiGe) 1, 2 to produce a laser.

The invention claimed is:

1. A method of producing a stress relaxed monocrystalline layer structure on a nonlattice matched substrate, the method comprising the steps of:
    applying to the substrate epitaxially a monocrystalline layer structure comprising at least one layer, the monocrystalline layer structure forming with the substrate an interface that has a greater lattice parameter mismatch on the substrate than within the monocrystalline layer structure,
    selecting an overall layer thickness of the monocrystalline layer structure so that a dislocation density following growth is less than $10^3$ cm$^{-2}$,
    irradiating the monocrystalline layer by directing a beam of ions through the monocrystalline layer structure to generate predominantly point effects in the monocrystalline layer structure and an extended defect region in the substrate proximal to the monocrystalline layer structure,
    selecting an energy of the ions such that a mean range of the ions is greater than the total layer thickness of the monocrystalline layer structure, and
    thermally treating the monocrystalline layer structure after irradiation by the ion beam in a temperature range of 550° C. to 1000° C. in an inert, reducing or oxidizing atmosphere so that the monocrystalline layer structure above the extended defect region is stress relaxed and has a defect density less than $10^6$ cm$^{-2}$ and a surface roughness of less than 1 nm.

2. The method according to claim 1 in which the monocrystalline layer structure is deposited such that at the interface with the substrate it has a lattice parameter mismatch of at least 1.5%.

3. The method according to claim 1 in which the monocrystalline layer structure is deposited such that at the interface with the substrate it has at least twice as large a lattice parameter mismatch with the substrate than within the monocrystalline layer structure.

4. The method according to claim 1 in which the monocrystalline layer structure above the extended defect region is at least 60% stress relaxed.

5. The method according to claim 1 in which the monocrystalline layer structure comprises silicon-germanium (SiGe) or silicon-germanium-carbon (SiGeC) or silicon carbide.

6. The method according to claim 5 in which a layer with a declining concentration profile of Ge is applied as the monocrystalline layer structure to the substrate.

7. The method according to claim 5 in which a layer with a U-shaped concentration profile in Ge is applied as the monocrystalline layer structure to the substrate.

8. The method according to claim 1 in which the monocrystalline layer structure comprises a III-V compound semiconductor, a II-VI compound semiconductor or an oxidic perovskite.

9. The method according to claim 1 in which the monocrystalline layer structure comprises at least two layers.

10. The method according to claim 9 in which a first thin pseudomorphic Ge layer with a layer thickness $d_1$ which lies below the critical layer thickness for pseudomorphic growth of Ge on Si and a second $Si_{1-x}Ge_x$ layer with a thickness $d_2 \gg d_1$ is provided on the substrate as the monocrystalline layer structure.

11. The method according to claim 9 in which two Si—Ge layers as the monocrystalline layer structure are applied to the substrate, a first $Si_{1-x}Ge_x$ layer with a thickness $d_1$ and a second $Si_{1-y}Ge_y$ layer with a thickness $d_2$ and with x>y and $d_2 \gg d_1$.

12. The method according to claim 9 in which a first thin pseudomorphic Si—C layer with a carbon content of 1 to 2 atom % and a layer thickness $d_1$ and a second $Si_{1-x}Ge_x$ layer with a layer thickness $d_2 \gg d_1$ are applied as the monocrystalline layer structure to the substrate.

13. The method according to claim 9 in which at least one layer with an additional carbon content of 1 to 2 atomic % is applied.

14. The method according to claim 9 in which the monocrystalline layer structure comprises at least three layers.

15. The method according to claim 14 whereby as first and third layers of the monocrystalline layer structure layers are applied which with respect to composition and layer thickness are identical.

16. The method according to claim 1 in which for the irradiation He ions with a dose of about $1 \times 10^{16}$ cm$^{-2}$ are used for producing the extended defect region.

17. The method according to claim 1 in which for the irradiation Si ions with a dose of about $1 \times 10^{14}$ cm$^{-2}$ is used for producing the extended defect region.

18. The method according to claim 1 in which hydrogen ions, carbon ions, nitrogen ions, fluorine ions, boron ions, phosphorous ions, arsenic ions, silicon ions, germanium ions, antimony ions, sulfur ions, neon ions, argon ions, krypton ions are used for the irradiation to produce the extended defect region.

19. The method according to claim 1 in which the ion beam is directed through a lithographic mask so that the monocrystalline layer structure is only stress relaxed at a region irradiated by the beam.

20. The method according to claim 1 in which SOI (silicon on insulator) is used as the substrate with an Si layer whose layer thickness lies below 120 nm.

21. The method according to claim 1 in which silicon, silicon germanium (SiGe) silicon carbide (SiC) sapphire or an oxidic perovskite is used as the substrate.

22. The method according to claim 1 in which a second monocrystalline layer is deposited on the first-mentioned monocrystalline layer system before or after the ion irradiation and the thermal treatment and forms a stressed layer.

23. The method according to claim 1 in which the monocrystalline layer structure is bonded to a second substrate with an $SiO_2$ layer and at least the first-mentioned substrate is separated and then a further monocrystalline layer is so deposited on the first-mentioned monocrystalline layer structure that a stressed layer is formed.

24. The method according to claim 22 in which the further epitaxial layer is provided on a second substrate with an $SiO_2$ layer and then at least the first-mentioned substrate and the monocrystalline layer structure are separated.

25. The method according to claim 22 in which as a further monocrystalline layer a layer comprising silicon, germanium (SiGe) or an Si—Ge—C layer or a germanium layer is deposited.

26. The method according to claim 22 in which a n-MOSFET or p-MOSFET is made on a stressed silicon region forming a further layer.

27. The method according to claim 22 in which p-MOSFETs are formed on stressed silicon germanium (SiGe) regions forming further monocrystalline layers or on nonrelaxed layer structures.

* * * * *